United States Patent [19]

Hinoshita et al.

[11] 4,021,799

[45] May 3, 1977

[54] NON-LINEAR CODING SYSTEM

[75] Inventors: Shigehiko Hinoshita, Yokohama; Yukihiko Minezima, Kawasaki, both of Japan

[73] Assignee: Fujitsu Ltd., Kawasaki, Japan

[22] Filed: July 5, 1973

[21] Appl. No.: 376,808

Related U.S. Application Data

[63] Continuation of Ser. No. 142,833, May 11, 1971, abandoned.

[30] Foreign Application Priority Data

May 18, 1970 Japan .............................. 45-42257

[52] U.S. Cl. ......................... 340/347 AD; 325/38 B
[51] Int. Cl.² ........................................ H03K 13/22
[58] Field of Search ............ 325/38 B; 340/347 AD

[56] References Cited

UNITED STATES PATENTS

| | | | |
|---|---|---|---|
| 3,026,375 | 3/1962 | Graham | 325/38 B |
| 3,496,468 | 2/1970 | Kaneko et al. | 325/38 B |
| 3,628,148 | 12/1971 | Brolin | 325/38 B |

*Primary Examiner*—Charles D. Miller
*Attorney, Agent, or Firm*—Herbert L. Lerner

[57] ABSTRACT

A differential signal circuit employing a local decoder and comparator to forecast a reference amplitude to be coded by a non-linear coding system. A non-linear coding means connected to an controlled by the output of the forecast means adaptively varies a non-linear component of such reference amplitude. The reference amplitude to be coded is supplied to the coding means and the reference amplitude preceding the reference amplitude to be coded is supplied to the forecast means.

3 Claims, 9 Drawing Figures

NON-LINEAR CODING SYSTEM

This is a continuation of application Ser. No. 142,833, filed May 11, 1971 now abandoned.

DESCRIPTION OF THE INVENTION

The invention relates to a non-linear coding system. More particularly, the invention relates to a non-linear coding system for high efficiency transmission.

In the long distance transmission of wideband signals such as, for example, video signals, it is important to understand that high efficiency transmission is attained by band compression or elimination of redundancy. It follows that a corresponding decrease in the cost of the transmission takes place with high efficiency transmission. Various kinds of prior art high efficiency video signal transmission systems are known. In these systems, special information or data is contained in the video signals.

It is known to utilize a differential PCM system for digital transmission at high efficiency. In the differential PCM system, in the video signals the correlation between adjacent picture elements is great. In such known system, video signals are sampled at a constant period and the difference signal between the new sample amplitude and the preceding reference amplitude or the forecast amplitude of the succeeding sample is coded. In accordance with such system, a transmission of the same quality may be provided by a smaller number of bits, compared with the system in which the reference amplitude is coded directly.

The differential PCM system has many advantages which may be practically utilized with great effect. The differential PCM system, however, has the following defects. In order to increase the efficiency of the dynamic range of a coder, it is desired to lower the overload point. If signals of large variation are applied, however, the amount of variation cannot be followed because of the overload of the coder. Consequently, there is a resultant slope overload. The second disadvantage is that in the coding of the amplitude magnitude near an end of the amplitude range of the input signal, only approximately half of the dynamic range of the coder may be effectively utilized. This is because, although the polarity of the difference signal is substantially limited to one of two polarities, the coder has positive and negative coding characteristics which are symmetrical to each other. The third disadvantage is that the DC component cannot be transmitted without the provision of special equipment, because only the difference signal is transmitted.

An object of the present invention is to provide a non-linear coding system which overcomes the disadvantages of known similar types of systems and which provides high efficiency transmission.

A further object of the present invention is to provide a non-linear coding system suitable for use in a digital PCM transmission system for transmitting video signals or various types of similar signals at high efficiency.

Another object of the invention is to provide a non-linear coding system which transmits wideband signals for long distances with efficiency, effectiveness and reliability.

Still another object of the invention is to provide a PCM coding system which utilizes the advantageous features of the known differential PCM systems and eliminates the disadvantages of such systems while providing high efficiency coding of video signals.

In accordance with the invention, a companding characteristic of the non-linear PCM coding is employed and suitably varied for the coding a specific reference amplitude, by introducing a decoded non-linear signal component derived from a forecast of a preceding sample amplitude.

In accordance with the invention, there is provided a non-linear coding system including circuit means employing a local decoder connected to the output of a comparator for forecasting a reference amplitude to be coded; a non-linear coding means connected to and controlled by the output of the circuit means, of the type mentioned above, adaptively varies the non-linear component of such reference amplitude; an input means for supplying the reference amplitude to be coded to such non-linear coding means, and an input means for supplying to the forecast means, of the type mentioned above, reference magnitude preceding the reference amplitude to be coded.

The non-linear coding means has an output and an input; and the circuit means, of the type mentioned above has its output connected to the input of the non-linear coding means and its input connected to the output of the non-linear coding means; such circuit means is adapted to supply the preceding reference amplitude without modification to the non-linear coding means.

The circuit means is provided with an output; an input and the non-linear coding means includes an output connected to the input of the forecast means and an input connected to the output of the forecast means. Coded signals corresponding to a preceding reference amplitude are supplied to such circuit means.

A digital to analog converter is provided and has its input connected to the non-linear coding means output. The non-linear coding means supplies coded signals to the digital-to-analog converter corresponding to the preceding sample amplitude. The differential signal circuit means has an input connected to the output of the digital to analog converter and an output connected to the input of the non-linear coding means. The digital-to-analog converter provides analog signals from the coded signals corresponding to the preceding sample amplitude.

The non-linear coding means may suitable circuit means adapted to provide non-linear component curves based upon a fundamental non-linear component curve derived from the sample amplitude and thereafter moving the fundamental non-linear component curve parallel relative to horizontal and vertical axes. Furthermore, the non-linear coding means comprises input means for providing input signals and reference signals. A comparator connected to the input means produces coded signals corresponding to the input signals. A first digital to digital converter connected to the previously forecast means described receives output signals from such forecast means. A subtraction circuit connected to the output of the comparator and to the output of the digital to digital converter produces difference signals in response the difference between the output of the comparator and the output of the digital to digital converter. A second digital to digital converter is connected to the output of the subtraction circuit through a first switch means. An adder is connected to the output of the second digital to digital converter and also connected to the output of the forecast means through a second switch means for producing sum signals corresponding to the sum of the output signals of the forecast means and the second digital to digital converter.

Each of the first and second switch means is connected to and controlled by the subtraction circuit in a manner whereby when an overflow occurs in the subtraction circuit, the overflow switches over the first and second switch means disconnects the subtraction circuit from the second digital to digital converter and disconnects the output of the forecast means from the adder.

Each of the first and second digital to digital converters comprises a digital decoder and a matrix connected to the digital to digital converter.

The non-linear coding means may comprise input means for providing input signals and reference signals. A comparator connected to the input means produces coded signals corresponding to the input signals. A read only memory is connected to the output of the forecast means and connected to the output of the comparator.

In order that the invention may be more readily understood reference will now be made with reference to the accompanying drawings, wherein.

Figure 2:
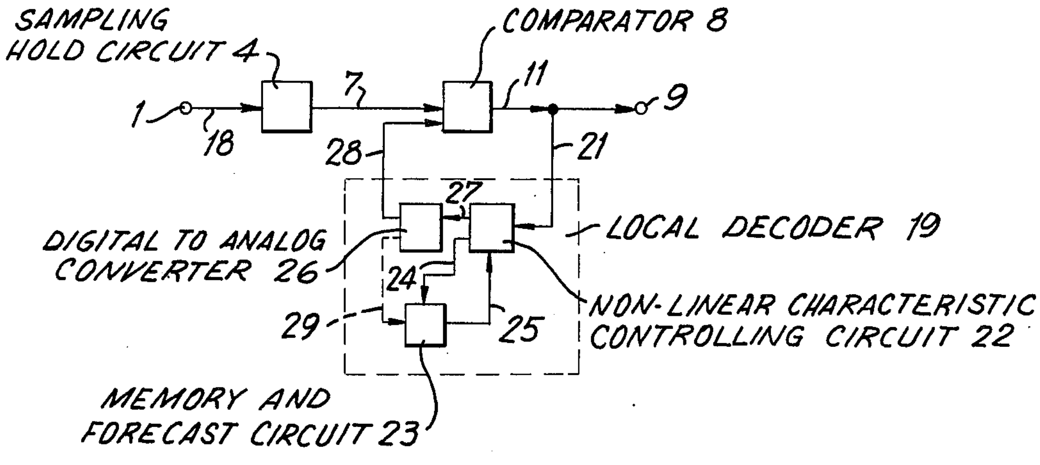
FIG. 2 is a block diagram of an embodiment of the non-linear coder of the invention.
Figure 3A:
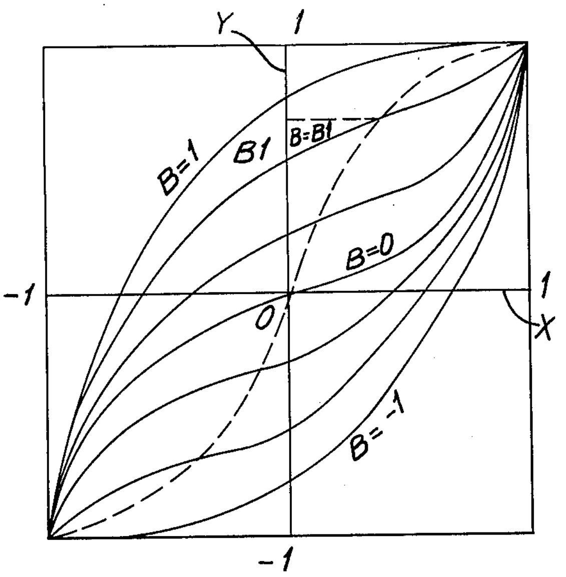
Figure 3B:
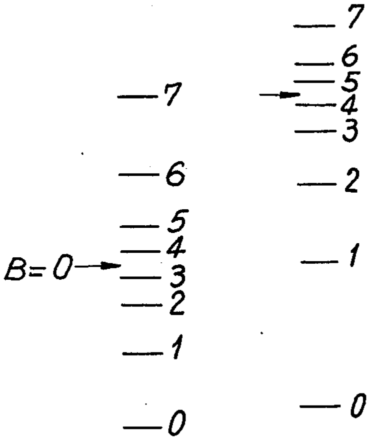
Figure 4:
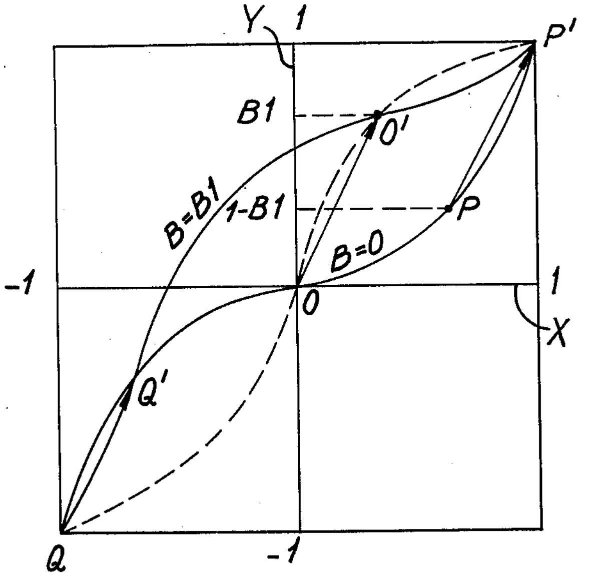
Figure 5:
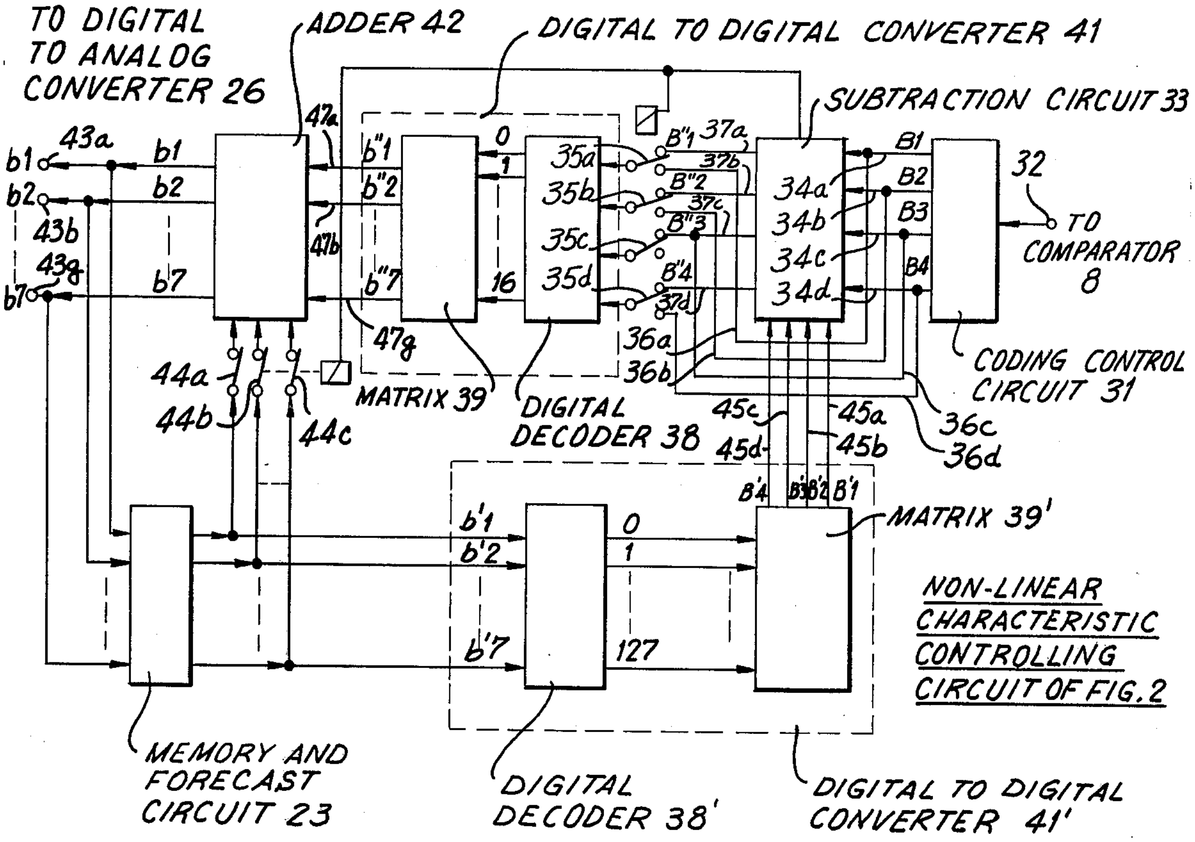
Figure 8:
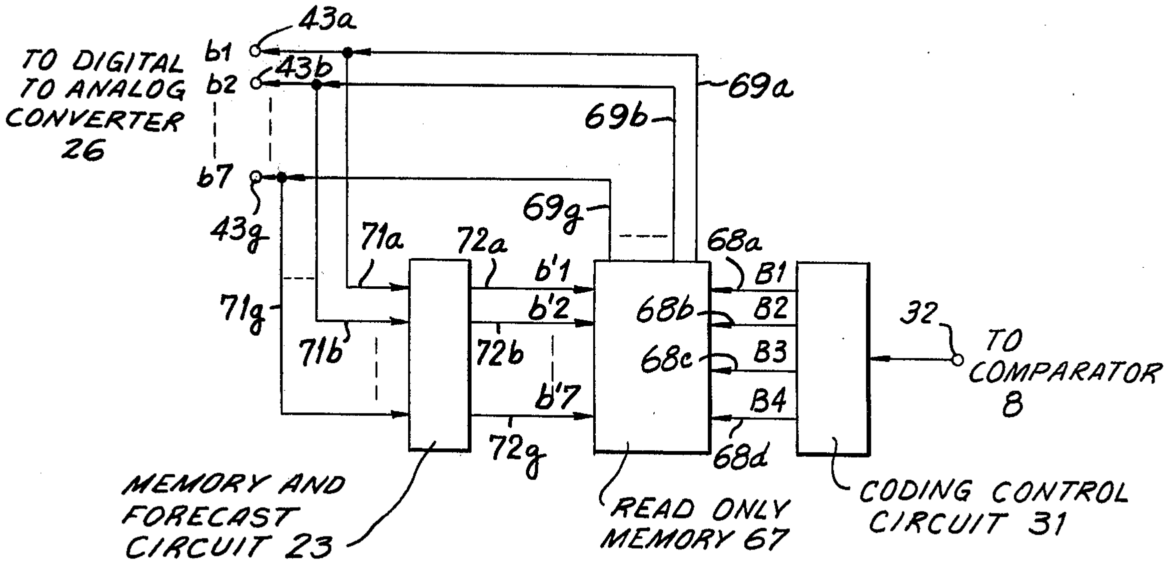
Figure 6:
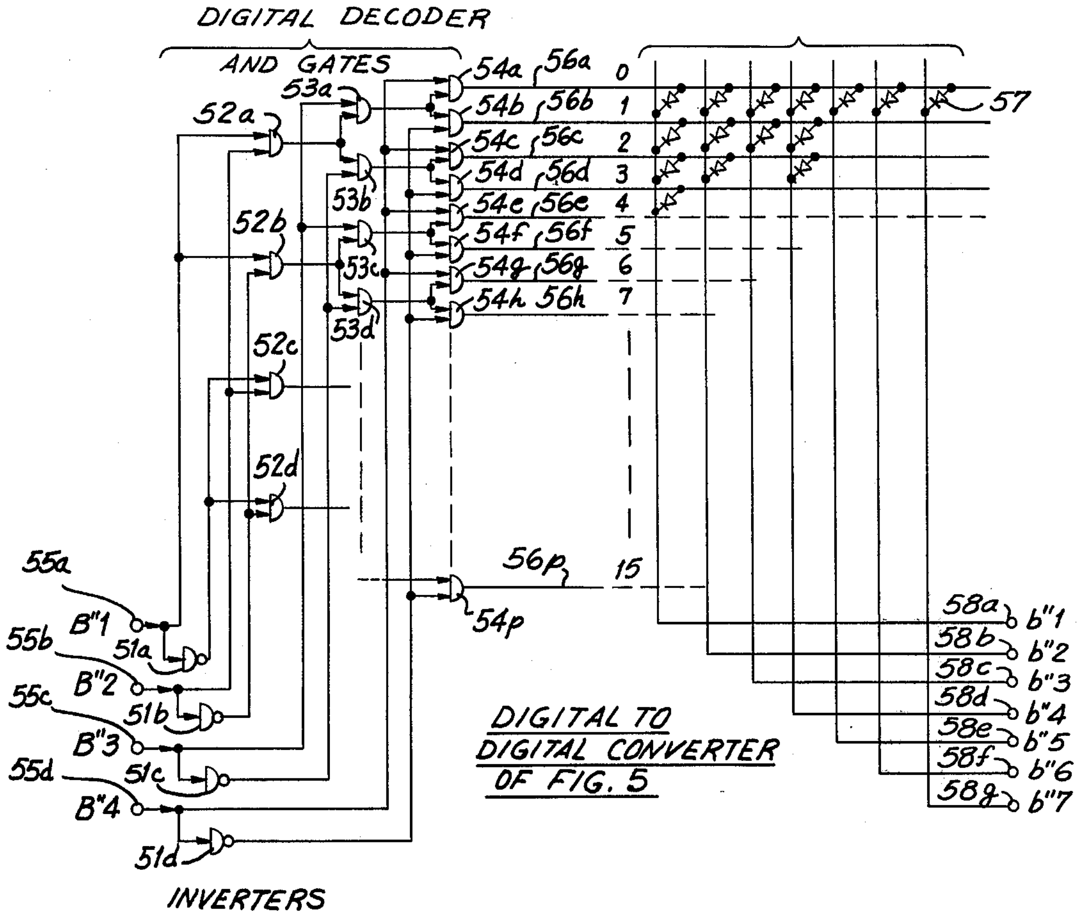
Figure 7:
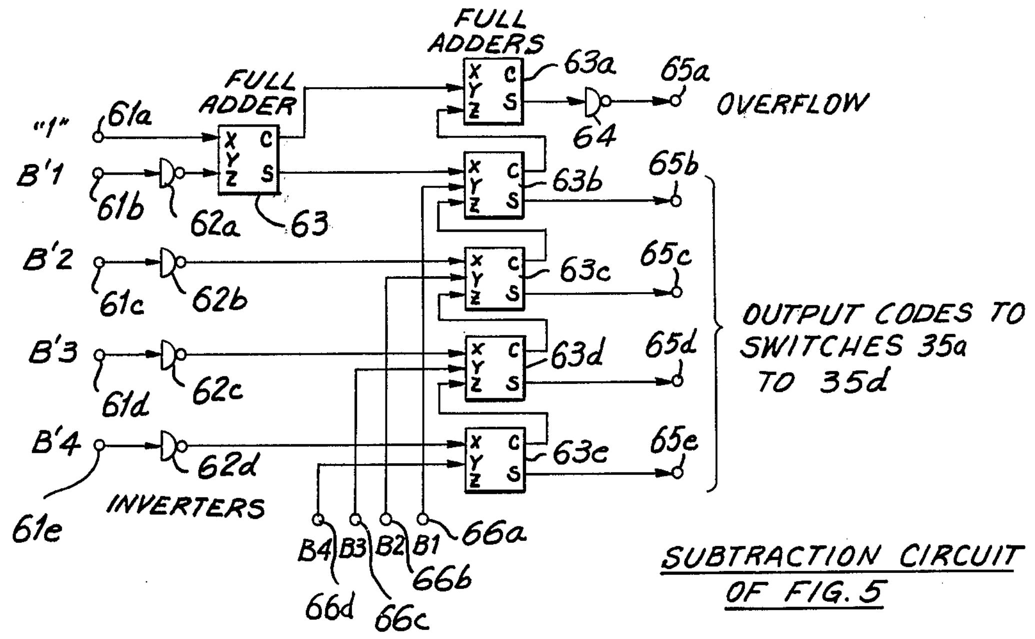

FIGS. 3*a* and 3*b* are graphical presentations explaining the operation of the non-linear coding system of the invention;

FIG. 4 is another graphical presentation further explaining the operation of the non-linear coding system of the invention;

FIG. 5 is a block diagram of an embodiment of the non-linear component control circuit of FIG. 2;

FIG. 6 is a circuit diagram of an embodiment of the digital to digital converter of FIG. 5;

FIG. 7 is a block diagram of an embodiment of the subtraction circuit of FIG. 5; and FIG. 8 is a block diagram of another embodiment of the non-linear component control circuit of FIG. 2.

Figure 1:
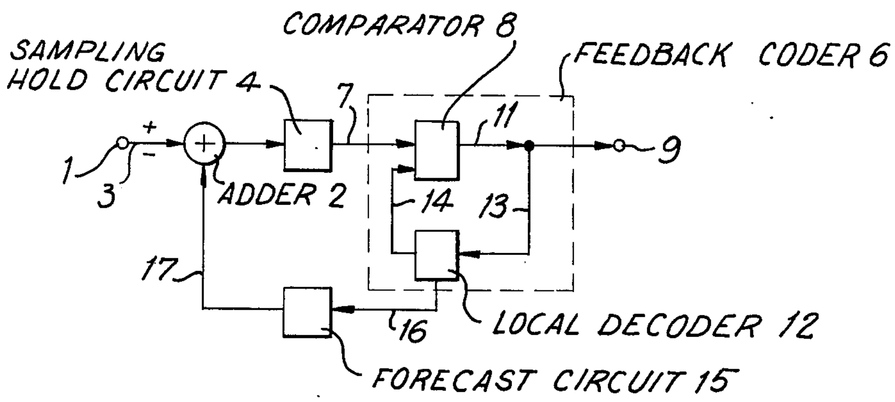
FIG. 1 is a block diagram of a known type of differential PCM coder.

In FIG. 1, an input terminal 1 is connected to one input of an algebraic adder 2 via a lead 3. The output of the algebraic adder 2 is connected to the input of a sampling hold circuit 4. The output of the sampling hold circuit 4 is connected to the input of a feedback coder 6 via a lead 7. The feedback coder 6 comprises a comparator 8 having an input connected to the lead 7 and an output connected to an output terminal 9 via a lead 11.

The feedback coder 6 further comprises a local decoder 12 having an input connected to the output of the comparator 8 via the lead 11 and a lead 13 and an output connected to another input of the comparator 8 via a lead 14. Another output of the local decoder 12 is connected to the input of a forecast circuit 15 via a lead 16. The output of the forecast circuit 15 is connected to another input of the adder 2 via a lead 17.

In FIG. 1, the output of the local decoder 12 is supplied to the forecast or integrator circuit 15, which forecast circuit produces the approximate decoded signal of the input signal supplied to the input terminal 1. The signal in the lead 17 is thus the approximate decoded signal of the input signal supplied to the input terminal 1. The algebraic adder 2 provides the difference signal between the approximate decoded signal in the lead 17 and the input signal in the lead 3. The difference signal is supplied to the sampling hold circuit 4 and is then coded in the feedback coder 6. The differential PCM output signal is thus provided in the output terminal 9.

FIG. 2 shows the non-linear coding system of the invention. More particularly, FIG. 2 shows the novel local decoder of the non-linear coding system of the invention. In FIG. 2, the input terminal 1 is connected to the input of the sampling hold circuit 4 via a lead 18. The output of the sampling hold circuit is connected to an input of the comparator 8 via the lead 7. The output of the comparator 8 is connected to the output terminal 9 via the lead 11 and to the input of a local decoder 19 via the lead 11 and a lead 21. The local decoder 19 comprises a non-linear component control circuit 22 having an input connected to the lead 21. The local decoder 19 further comprises a memory and forecast circuit 23, to be defined in more detail hereafter, having an input connected to an output of the non-linear component control circuit 22 via a lead 24 and an output connected to another input of said non-linear component control circuit via a lead 25.

The local decoder 19 further comprises a digital to analog converter 26 having an input connected to another output of the non-linear component control circuit 22 via a lead 27, and an output connected to another input of the comparator 8 via a lead 28. Another output of the digital to analog converter 26 may be connected to another input of the memory and forecast circuit 23, via a lead 29, shown in broken lines.

The output signal provided by the sampling hold circuit 4 is compared with the output voltage produced by the local decoder 19 in the comparator 8. The polarity or sign of the difference determines the PCM output provided at the output terminal 9. The aforedescribed operation is similar to the operation of the known feedback type differential coder. The local decoder 19 has a considerable characteristic. The magnitude of a preceding sample is derived from the local decoder 19 as a digital magnitude from the output of the non-linear component control circuit 22.

The digital magnitude provided at the output of the non-linear component control circuit 22 is stored in the a memory and forecast circuit 23. The memory and forecast circuit 23 forecasts the amplitude of a specific reference to be coded by suitable means i.e. decoder and comparator means, and which succeeds the preceding reference amplitude, and the output produced by such memory and forecast circuit is connected to the input of the non-linear component control circuit 22 to provide a non-linear characteristic which is advantageous for decoding of the specific reference amplitude. This value may also be derived as an analog magnitude by utilizing a digital to analog converter 26. In such an instance, the output of the digital to analog converter 26 is supplied to the memory and forecast circuit 23 via the lead 29.

Heretofore, only the companding gain A has been included as a parameter in the non-linear characteristic representing the relation between the normalized input of the coder or the normalized output of the decoder Y and the normalized output of the coder or the normalized input of the decoder X. In the case of the coder of FIG. 2, however, the forecast magnitude B of the specific sample is also included as a parameter. X and Y may be expressed as $$Y = f(X, A, B)$$

wherein X, Y, B are equal to or greater than −1 and are equal to or less than 1. This indicates a group of curves which is varied by B, even if A is kept constant. An example of such a group of curves is shown in FIG. 3*a*.

In FIG. 3*a*, the curve B = 0 is a conventionally utilized asymmetric companding characteristic and provides the fundamental characteristic for the group of curves. FIG. 3*b* illustrates the magnitudes of the quantization step when B = 0 and B = B1 in FIG. 3*a*. This assumes that a coding of three bits is performed. When the amplitude of the preceding sample is utilized as the amplitude of B, the smaller the difference between the preceding sample amplitude and the amplitude to be coded, and the more finely the quantization is performed. Furthermore, coding is possible over the entire dynamic range of the input signals, and it follows that a characteristic suited for the coding of the video signals may be obtained.

Obviously, our invention may also be effectively applied to other signal sources by selecting a suitable companding characteristic for such signal sources. Furthermore, the system of the invention is essentially a PCM transmission system, although the companding characteristic can be varied with the result that the DC component may be transmitted.

In a system wherein a specific sample amplitude is determined by utilizing the preceding reference amplitude, there are always problems of propagation of error in the decoded signal due to transmitted code errors and decoding errors due to the deviation of the initial magnitudes of the transmission and reception.

When varying the optimum companding characteristic in response to an information source corresponding to amplitude B, complicated operations are often required. Therefore, from the practical point of view, it is desirable to facilitate the method while effectively utilizing the characteristic varying function. An example of the method of obtaining a varied characteristic by parallel movement, expansion or combination of the fundamental curve B = 0 is shown in FIG. 4.

For example, the case of B being equal to or greater than zero in the example of FIG. 4 is explained. When B equals B1 which is equal to or greater than zero, the curve P′0′Q′ is first provided by the parallel movement of the fundamental curve P′P0Q′Q from 0 to 0′. The curve P′O′Q′ is first utilized. Then, in addition to the curve P′0′Q′, the interval Q′Q of the fundamental curve is utilized without modification.

When B is equal to or less than zero, the same operation is provided, although in this case the fundamental curve must be moved in the reverse direction. As a result of the aforedescribed operation, a companding characteristic equivalent to the companding characteristic available around the origin of the fundamental curve becomes available around Y = B1, which is the preceding sample magnitude or the forecast magnitude of the sample to be coded.

In the aforedescribed non-linear coding system of the invention illustrated in FIG. 2, the sampling hold circuit 4 may comprise any suitable circuit known in the art, as may the comparator 8 and the digital to analog converter 26. Since the circuits 4, 8 and 26 of FIG. 2 may comprise any suitable circuit known in the art, they are not described herein in detail. The non-linear component control circuit 22 and the memory and forecast circuit 23 of the local decoder 19 are described in detail with reference to FIG. 5. FIG. 5 illustrates an embodiment of the non-linear component control circuit 22 of FIG. 2.

In FIG. 5, a coding control circuit 31 is provided in the feedback circuit of a feedback coder which is generally utilized in PCM communications. The coding control circuit 31 may comprise any suitable known circuit such as, for example, that shown in FIG. 19, page 198, of the Bell System Technical Journal, Volume 41, No. 1, January 1962, published by the American Telephone and Telegraph Company. An input terminal 32 is connected to the input of the coding control circuit 31. The coding control circuit has four outputs connected to the corresponding ones of four inputs of a subtraction circuit 33 via leads **34*a*, 34*b*, 34*c* and 34*d***.

The four outputs of the coding control circuit 31 are also connected to the contacts corresponding of a plurality of switches **35*a*, 35*b*, 35*c* and 35*d* via leads 36*a*, 36*b*, 36*c* and 36*d*. The subtraction circuit 33 has a plurality of outputs connected to corresponding contacts of the switches 35*a*, 35*b*, 35*c* and 35*d* via leads 37*a*, 37*b*, 37*c* and 37*d*. The fixed contacts of each of the switches 35*a* to 35*b* are connected to corresponding ones of the inputs of a digital decoder 38. The digital decoder 38 has a plurality of sixteen outputs each connected to a corresponding one of a corresponding number of inputs of a matrix 39. The digital decoder 38 and the matrix 39 function as a digital to digital converter 41**.

The matrix 39 has a plurality of seven outputs each connected to a corresponding number of inputs of a sequential adder 42. The adder 42 having associated switches to be described hereafter has a plurality of seven outputs each of which is connected to a corresponding output terminal **43*a*, 43*b* . . . 43*g*. Each of the output terminals 43*a* to 43*g* in turn is connected to the digital to analog converter 26 of FIG. 2. Each of the outputs of the adder 42 is also connected to a corresponding number of inputs of the memory and forecast circuit 23 of FIG. 2. The memory and forecast circuit 23 of FIG. 2 has a plurality of seven outputs, each of which is connected to a corresponding one of the seven inputs of a digital decoder 38′ of a digital to digital converter 41′. Each of the outputs of the memory and forecast circuit 23 is also connected to a corresponding contact of a plurality of switches 44*a*, 44*b* . . . 44*g*. The other corresponding contacts of each of the switches 44*a*, 44*b* . . . 44*g* is connected to a corresponding one of seven additional inputs of the adder 42**.

The digital to digital converter 41′ further comprises a matrix 39′ having a plurality of 127 inputs each of which is connected to a corresponding output of the digital decoder 38′. The matrix 39′ has a plurality of four outputs each of which is connected to a corresponding additional input of the subtraction circuit 33 via leads **45*a*, 45*b*, 45*c* and 45*d*. Each of the groups of switches 35*a* to 35*d* and 44*a* to 44*g* is controlled in any suitable manner by an additional output of the subtraction circuit 33 via a lead 46. Although these switches are illustrated as being controlled by relay windings, this is not necessarily the case, but is merely shown as a simple means of illustration. Actually, the switches 35*a* to 35*d* and 44*a* to 44*g* are preferably electronic switches which are suitably controlled by current in the lead 46. Furthermore, the digital to digital converter 41 and the digital to digital converter 41′** are similar to each other and utilize similar circuitry.

The digital to digital converter 41 provides the fundamental companding characteristic to the signal and, as hereinafter described, may comprise the circuit shown in FIG. 6. In FIG. 5, input signals of four bits of minor bit codes are converted into output signals of seven bits of major bit codes. The four bits are provided corresponding to the quantization levels available by equally dividing the X axis of FIG. 4 into sixteen parts, corresponding to $2^4$, and the seven bits are provided corresponding to the quantization level of the Y axis of the fundamental companding curve A = 0 of FIG. 4, corresponding to said quantization levels. The digital to digital converter 41′ provides a converting function which is the reverse of the converting function of the digital to digital converter 41. The digital to digital converter 41′ converts the quantization levels of the Y axis by seven bits into the quantization levels of the X axis shown by four bits, in accordance with the broken line curve of FIG. 4 having the characteristic of the curve B = 0 of FIG. 4. The switches 35*a* to 35*d* and 44*a* to 44*g* are controlled by overflow signals provided by the subtraction circuit 33 in the lead 46.

In FIG. 5, the preceding reference magnitude stored in the memory forecast circuit 23 is utilized as the forecast amplitude of the sample to be coded. The forecast amplitude is indicated by codes of seven bits *b*′1, *b*′2 . . . *b*′7, which are equivalent to B1 of FIG. 4. The codes of seven bits are converted into codes of four bits B′1, B′2, B′3, B′4, equivalent to the magnitude of B1–0′ of FIG. 4, by the digital to digital converter 41′. The codes B′1, B′2, B′3, B′4 are supplied to one set of inputs of the subtraction circuit 33 via the leads 45*a* to 45*d*. The comparator 8 of FIG. 2 produces a plurality of output pulses B1, B2, B3, B4, which are supplied, via the input terminal 32 and the coding control circuit 31, to another plurality of inputs of the subtraction circuit 33 via the leads 34*a* to 34*d*.

The subtraction circuit 33 subtracts B′1, B′2, B′3, B′4 from B1, B2, B3, B4 and produces difference signals B″1, B″2, B″3, B″4, which are supplied to the digital to digital converter 41 via the leads 37*a* to 37*d* and the switches 35*a* to 35*d*. The aforedescribed converting operation is performed by the converter 41, so that the signals B″1, B″2, B″3, B″4 are converted into output signals *b*″1, *b*″2, *b*″3, *b*″4, *b*″5, *b*″6, *b*″7, which output signals are available at the output of said converter. This conversion characteristic is equivalent to a curve provided by the parallel movement of the curve B = 0 of FIG. 4 by an amount B1 - 0′ in the X axis direction. The output signals *b*″1, *b*″2 . . . *b*″7 from the converter 23 are supplied to first inputs of the adder 42 via leads 47*a* to 47*g*.

The signals *b*′1, *b*′2 . . . *b*′7, equivalent to B1, which is the content of the memory and forecast circuit 23, are supplied to the other inputs of the adder 42 via the switches 44*a* to 44*g*, which are then in their normally closed condition. The switches 35*a* to 35*d* and 44*a* to 44*g* are in their closed condition, shown in FIG. 5, when there is no overflow in the output lead 46 of the subtraction circuit 33. The adder 42 therefore adds the signals *b*″1 to *b*″7 and the signals *b*′1 to *b*′7. The conversion characteristic of the conversion from the outputs B1, B2, B3, B4 of the coding control circuit 31 to the outputs *b*1 to *b*7 of the adder 42 becomes equivalent to the curve P′0′Q′ provided by the parallel movement of the curve P′0Q of B = 0 of FIG. 4 in the X axis direction by the amount B1–O′ and in the Y axis direction by the amount 0–B1.

It is assumed, on the other hand, that the actual input signals, contrary to the forecast, have a magnitude greatly different from the forecast magnitude. That is, it is assumed that the actual input signals have a magnitude of the scope equivalent to QQ′ of FIG. 4. An overflow then occurs in the subtraction circuit 33 and when detected, it is supplied via the lead 46 to the switches 35*a* to 35*d* and 44*a* to 44*g* where such switches are switched opposite those shown in FIG. 5. Due to the switching over of the switches 35*a* to 35*d*, the signals B1 to B4 are supplied from the coding control circuit 31 to the digital to digital converter 41 via the leads 36*a* to 36*d* bypassing the subtraction circuit 33. Due to the switching over of the switches 44*a* to 44*g*, the adder 42 does not perform an addition, since only the signals *b*″1 to *b*″7 are supplied to its inputs. Thus, no subtraction or addition is performed.

When no subtraction or addition is performed, there is no parallel movement of the signals, and in this case the digital to digital conversion is performed in accordance with the curve of the fundamental non-linear characteristic B = 0. Therefore, the scope of QQ′ is not moved from the position of the initial reference curve, as shown in FIG. 4, and, as a whole, the required characteristic indicated by P′0′Q′Q may be obtained for the entire dynamic range of X, as shown in FIG. 4.

As shown in FIG. 5, each of the digital to digital converters 41 and 41′ comprises a digital decoder and a matrix. The digital decoder is provided with a plurality of outputs equal in number to the levels represented by the input codes. The input signals supplied to the digital to digital converter are converted by the digital decoder so that signals may be generated in the outputs. The outputs of the decoder are connected to the inputs of the matrix which provides converted outputs corresponding to the levels represented by the input codes.

FIG. 6 illustrates a digital to digital converter which may be utilized in the non-linear characteristic controlling circuit of FIG. 2. The digital decoder, as shown in FIG. 6, comprises a plurality of four inverters 51*a*, 51*b*, 51*c* and 51*d* and a plurality of AND gates 52*a* to 52*d*, 53*a* to 53*h* and 54*a* to 54*p*. The digital decoder has a plurality of input terminals 55*a* to 55*d* and a plurality of output leads 56*a* to 56*p*. The 16 outputs 0 to 15 in the output leads 56*a* to 56*p* are produced by the combination of codes B″1, B″2, B″3, B″4 supplied as input signals to the inputs 55*a* to 55*d*.

Although the remaining output leads 8 to 15 are not shown in FIG. 6, the digital decoder is a known circuit and the circuitry which is not shown is repetitive, and therefore similar to that shown in FIG. 6. The sixteen output leads 56*a* to 56*p* are supplied to corresponding inputs of the matrix. The matrix comprises a plurality of diodes 57 which are suitably interconnected in the manner of known matrices. The part of the matrix corresponding to the output leads 4 to 15 is not shown in the drawing, since this portion of the matrix is also known in the art. Since a signal source is provided at a plurality of inputs of the matrix, logical 1 signals are produced by the portions of the matrix provided with diodes and logical 0 signals are produced by the portions of the matrix which are not provided with diodes. The logical 1 and 0 signals are provided at a plurality of output terminals 58*a* to 58*g*. The output signals provided at the output terminals 58*a* to 58*g* are b″1 to *b*″7, respectively.

In the example shown in FIG. 6, therefore, the signals B"1, B"2, B"3, B"4 are converted into signals b"1, b"2, b"3, b"4, b"5, b"6, b"7, in the following manner.

| B"1 | B"2 | B"3 | B"4 | b"1 | b"2 | b"3 | b"4 | b"5 | b"6 | b"7 |
|---|---|---|---|---|---|---|---|---|---|---|
| 1 | 1 | 1 | 1 | 1 | 1 | 1 | 1 | 1 | 1 | 1 |
| 1 | 1 | 1 | 0 | 1 | 1 | 1 | 1 | 0 | 0 | 0 |
| 1 | 1 | 0 | 1 | 1 | 1 | 0 | 1 | 0 | 0 | 0 |
| 1 | 1 | 0 | 0 | 1 | 0 | 0 | 0 | 0 | 0 | 0 |
| . | . | . | . | . | . | . | . | . | . | . |
| . | . | . | . | . | . | . | . | . | . | . |
| . | . | . | . | . | . | . | . | . | . | . |
| . | . | . | . | . | . | . | . | . | . | . |
| . | . | . | . | . | . | . | . | . | . | . |

Obviously, the digital to digital converter is not limited to the example shown in FIG. 6, but may comprise any suitable digital to digital converter. The digital to digital converters 41 and 41', as hereinbefore mentioned, may comprise the same circuitry. The function of the digital to digital converters may be readily obtained by the use of read only memories which are commercially available (such as, for example, those sold by the INTEL Corporation as the Bipor ROM Memory 3301).

An example of a circuit which may be utilized as the subtraction circuit 33 of FIG. 5 is shown in FIG. 7. The subtraction circuit 7 comprises a plurality of inputs 61a to 61e, a plurality of inverters 62a to 62d, a plurality of full adders 63 and 63a to 63e, an inverter 64 and a plurality of output terminals 65a to 65e. The subtraction circuit of FIG. 7 also includes a plurality of inputs 66a to 66d.

The signals B'1, B'2, B'3, B'4, indicating the forecast magnitude, are supplied to the input terminals 61b to 61e and are inverted by the iverters 62a to 62d. The outputs of the inverters 62a to 62d are added to the signals 1000 supplied to the input terminals Z of the full adders 63a to 63e and to the signals B1, B2, B3, B4 supplied via the input terminals 66a to 66d to the input terminals Y of the full adders 63b to 63e. The outputs of the inverters 62a to 62d are supplied to the input terminals X of the full adders 63b to 63e. The last four digits of the output signals of the full adders 63a to 63e are provided at the output terminals 65b to 65e and are the output codes which are supplied to the switches 35a to 35d of FIG. 5. The first digit of the output signals of the full adders 63a to 63e is provided at the output terminal 65a and is the overflow signal.

As a result of the operation of the subtraction circuit, if it is assumed that the codes 0111 represent the origin of the horizontal axis of FIG. 4, an output of the amount B1–0' may be obtained. The adder 42 of FIG. 5 may comprise a circuit of similar structure to that of the subtraction circuit of FIG. 7. The switches 35a to 35d and 44a to 44g preferably comprise commercially available logical switching circuits.

FIG. 8 illustrates another embodiment of the non-linear characteristic controlling circuit of FIG. 5. The non-linear characteristic controlling circuit of FIG. 8 may be provided by substituting a commercially read only available analog memory 67 adapted to receive forecast magnitude signals for the remainder of the circuit of FIG. 5 other than the memory and forecast circuit 23 and the coding control circuit 31. In FIG. 8, the input terminal 32 from the comparator 8 is connected to the inputs of the coding control circuit 31 and the outputs of said coding control circuit 31, which are the signals B1, B2, B3, B4, are supplied to corresponding inputs of the read only memory 67 via leads 68a, 68b, 68c and 68d. The outputs of the read only memory 67 are connected to corresponding ones of the output terminals 43a to 43g via leads 69a to 69g. The outputs of the read only memory 67 are also connected to corresponding inputs of the memory and forecast circuit 23 via the leads 69a to 69g and 71a to 71g. The outputs of the memory and forecast circuit 23 are connected to corresponding inputs of the read only memory 67 via leads 72a to 72g.

In the non-linear characteristic controlling circuit of FIG. 8, two types of input signals B1, B2, B3, B4 and b'1, b'2, b'3, b'4, b'5, b'6, b'7 are digitally converted to obtain output signals b1, b2, b3, b4, b5, b6, b7, which are provided at the outputs 43a to 43g and are supplied to the digital to analog converter 26 (FIG. 2). In this case, a read only memory having a storage capacity of seven bits is required for each of $2^7$ times $2^4$ addresses. In the circuit of FIG. 8, if the storage content of the read only memory 67 is designated, not only may the simplified companding characteristic provided by the modification of the fundamental characteristic shown in FIG. 4 be designated, but the companding characteristics best suited for the signals to be transmitted, as shown in FIG. 3, may be freely designated.

Any suitable circuit other than the aforedescribed circuit, capable of adaptively varying the companding characteristic, may be utilized.

As hereinbefore described, the coding system of the invention permits the coding of the information source to be transmitted and provides high efficiency transmission. The cost of transmission is considerably reduced when the coding system of the invention is utilized for the transmission of video signals and the like.

While the invention has been described by means of specific examples and in specific embodiments, we do not wish to be limited thereto, for obvious modifications will occur to those skilled in the art without departing from the spirit and scope of the invention.

We claim:

1. A non-linear coding system comprising a comparator means (8) and a local decoder means (19), said comparator means (8) comparing a sample magnitude signal with the reference magnitude signal out of said local decoder means (19) and codes the difference between said signals, said local decoder means (19) comprising:

a. a non-linear characteristic conrolling means (22), a lead (21) connecting an output of said comparator means (8) with an input of said non-linear characteristic controlling means 22, said non-linear characteristic controlling means (22) selecting a non-linear characteristic according to the forecast sample magnitude and characterizing the output of the comparator means (8) with the non-linear characteristic, said non-linear characteristic controlling means (22) having an output (27), b. a digital to analog converter means (26) having an input connected to said output (27) of said non-linear characteristic controlling means (22) for converting the output of said non-linear characteristic controlling means (22) to the reference magnitude signal, and c. memory forecast means (23) having an output (25) connected to said non-linear characteristic controlling means (22) for providing a forecast sample magnitude signal from a preceding sample magnitude signal, said non-linear characteristic controlling means (22) comprising:

a. first digital to digital converter means (41′)

b. means connecting said first digital to digital converter means (41′) to said forecast means (23) for converting the forecast sample magnitude signal in accordance with the conversion characteristic of a fundamental non-linear characteristic, c. an output (45*a*, 45*b*, 45*c*, 45*d*), d. subtraction circuit means (33) connected to the output of said first digital to digital converter means (41′) for producing difference signals indicating the difference between the output of the comparator means (8) and the output of the first digital to digital converter means (41′) and providing an overflow signal when an overflow occurs in said subtraction circuit means (33), e. first switch means (35*a*, 35*b*, 35*c*, 35*d*) supplied with the output of said comparator means (8) and the difference signals out of said subtraction circuit means (33) and controlled by said overflow signal, f. second digital to digital converter means (41) connected to said first switch means (35*a*, 35*b*, 35*c*, 35*d*) for connecting an output of said first switch means (35*a*, 35*b*, 35*c*, 35*d*) in accordance with the fundamental non-linear characteristic, said second digital to digital converter means (41) having an output, g. second switch means (44*a*, 44*b*, 44*c*) supplied with the forecast sample magnitude signal out of said forecast means (23) and controlled by said overflow signal, and h. adder means (42) connected to the output of said second digital to digital converter means (41) and supplied with the forecast sample magnitude signal via said second switch means (44*a*, 44*b*, 44*c*) for adding said second output and the forecast sample magnitude signal.

2. A non-linear coding system according to claim 1 wherein each of said first switch means (35*a*, 35*b*, 35*c*, 35*d*) and said second switch means (44*a*, 44*b*, 44*c*) are controlled by the overflow signal out of said subtraction circuit means (33) in a manner whereby the overflow signal switches over said first and second switch means to disconnect said subtraction circuit means (33) from said second digital to digital converter means (41) and to disconnect the output of the forecasting means (23) from the adder means (42).

3. A non-linear coding system according to claim 1 wherein each of said first (41′) and second (41) digital to digital converter means comprises a digital decoder means (38′ and 38) and matrix means (39′ and 39) connected to said digital decoder means (38′ and 38) respectively.

* * * * *